United States Patent
Nishimura (10) Patent No.: US 7,993,540 B2
(45) Date of Patent: Aug. 9, 2011

(54) SUBSTRATE PROCESSING METHOD AND SUBSTRATE PROCESSING APPARATUS

(75) Inventor: Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 808 days.

(21) Appl. No.: 11/770,234

(22) Filed: Jun. 28, 2007

(65) Prior Publication Data

US 2008/0003365 A1    Jan. 3, 2008

Related U.S. Application Data (60) Provisional application No. 60/832,132, filed on Jul. 21, 2006.

(30) Foreign Application Priority Data

Jun. 29, 2006 (JP) .................. 2006-180185

(51) Int. Cl.
  *B44C 1/22* (2006.01)
  *C03C 15/00* (2006.01)
  *C03C 25/68* (2006.01)
  *C23F 1/00* (2006.01)
(52) U.S. Cl. .......................... 216/72; 438/738
(58) Field of Classification Search .................. 216/58, 216/67, 72; 438/738, 745
  See application file for complete search history.

(56) References Cited

U.S. PATENT DOCUMENTS

| | | | | |
|---|---|---|---|---|
| 5,658,417 A | * | 8/1997 | Watanabe et al. | ........ 156/345.31 |
| 5,990,019 A | * | 11/1999 | Torek et al. | .................... 438/723 |
| 5,994,238 A | * | 11/1999 | Park | ............................. 438/738 |
| 6,024,888 A | | 2/2000 | Watanabe et al. | |

FOREIGN PATENT DOCUMENTS

| | | |
|---|---|---|
| JP | 03-147322 | 6/1991 |
| JP | 03-204930 | 9/1991 |
| JP | 6-181188 | 6/1994 |
| JP | 08/330248 | 12/1996 |
| JP | 2002-217414 | 8/2002 |

OTHER PUBLICATIONS

Office Action issued Jan. 25, 2011, in Japanese Patent Application No. 2006-180185 (w/English-language translation).

\* cited by examiner

*Primary Examiner* — Roberts Culbert (74) *Attorney, Agent, or Firm* — Oblon, Spivak, McClelland, Maier & Neustadt, L.L.P.

(57) ABSTRACT

A substrate processing method which is capable of easily removing residue caused by hydrofluoric acid. By the substrate processing method, a substrate is processed which has a thermal oxide film formed by a thermal oxidation process and a BPSG film containing impurities. In an HF gas feeding step, an HF gas is fed toward the substrate, and in a cleaning gas feeding step, a cleaning gas containing at least $NH_3$ gas is fed toward the substrate fed with the HF gas.

12 Claims, 9 Drawing Sheets

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus, and more particularly to a substrate processing method for processing a substrate on which are formed a thermal oxide film and an oxide film containing impurities.

2. Description of the Related Art

There has been known a wafer (substrate) for semiconductor devices which has a thermal oxide film formed by a thermal oxidation process and an impurity-containing oxide film, such as a BPSG (Boron Phosphorous Silicate Glass) film, formed e.g. by a CVD process. The BPSG film is formed on a polysilicon film such that the polysilicon film is partially exposed, and functions as a hard mask during etching of the polysilicon film. On the other hand, the thermal oxide film forms a gate oxide film.

In this type of substrate, after etching the polysilicon film, it is required to selectively remove (etch) the BPSG film without removing (etching) the thermal oxide film.

Conventionally, an oxide film is etched using plasma generated from a CF-based gas. However, since the plasma generated from the CF-based gas etches not only the BPSG film, but also the thermal oxide film, it is difficult to secure a selection ratio of the BPSG film to the thermal oxide film, and hence the BPSG film cannot be selectively etched.

To overcome this problem, an etching method has been proposed which uses HF gas or a mixed gas of HF gas and $H_2O$ gas without turning the HF gas or the mixed gas into plasma (see e.g. Japanese Laid-Open Patent Publication (Kokai) No. H06-181188). This method makes it possible to preferentially remove the impurity-containing oxide film by hydrofluoric acid produced by combining HF gas and $H_2O$, so that the BPSG film can be selectively etched.

However, when HF gas or the mixed gas of HF gas and $H_2O$ gas is used to etch the BPSG film, etching residue is formed by reaction between $SiO_2$ and hydrofluoric acid to be deposited on the surface of a semiconductor wafer. This residue causes a short circuit and the like trouble in a semiconductor device manufactured from the wafer.

SUMMARY OF THE INVENTION

The present invention provides a substrate processing method and a substrate processing apparatus which are capable of easily removing residue caused by hydrofluoric acid.

In a first aspect of the present invention, there is provided a method of processing a substrate having a first oxide film formed by a thermal oxidation process and a second oxide film containing impurities, comprising an HF gas feeding step of feeding an HF gas toward the substrate, and a cleaning gas feeding step of feeding a cleaning gas containing at least $NH_3$ gas toward the substrate fed with the HF gas.

With the configuration of the first aspect of the present invention, the HF gas is fed toward the substrate having the first oxide film formed by the thermal oxidation process and the second oxide film containing impurities, and then further the cleaning gas containing at least $NH_3$ gas is fed toward the substrate. Hydrofluoric acid produced from the HF gas selectively etches the second oxide film, but forms residue at the same time. However, the $NH_3$ gas reacts with the residue to form a substance that is easy to sublimate. Therefore, it is possible to remove the residue through reaction with $NH_3$ and the sublimation. This makes it possible to easily remove the residue caused by hydrofluoric acid.

In an embodiment, $H_2O$ gas is not fed in the HF gas feeding step.

With the configuration of this embodiment, since the $H_2O$ gas is not fed in the HF gas feeding step, the HF gas and $H_2O$ are hardly combined in the first oxide film containing very little $H_2O$, and hence the first oxide film is hardly etched. This makes it possible to selectively etch the second oxide film with reliability.

In one embodiment, the substrate has a silicon-containing layer formed on the first oxide film and covered by the second oxide film, the second oxide film causing the silicon-containing layer to be partially exposed, and the silicon-containing layer is etched prior to the HF gas feeding step.

With the configuration of this embodiment, the silicon-containing layer is etched before the $H_2O$ gas is fed. This makes it possible to utilize the second oxide film as a hard mask in etching of the silicon-containing layer to thereby reliably etch the silicon-containing layer into a desired shape.

In a second aspect of the present invention, there is provided a method of processing a substrate having a first oxide film formed by a thermal oxidation process and a second oxide film containing impurities, comprising an HF gas feeding step of feeding an HF gas toward the substrate, and a substrate heating step of heating the substrate fed with the HF gas.

With the configuration of the second aspect of the present invention, the HF gas is fed toward the substrate having the first oxide film formed by the thermal oxidation process and the second oxide film containing impurities, and then further the substrate is heated. Hydrofluoric acid produced from the HF gas selectively etches the second oxide film, but forms residue at the same time. However, the residue is decomposed by heating. Therefore, it is possible to remove the residue by decomposition caused by heating. This makes it possible to easily remove the residue caused by hydrofluoric acid.

In one embodiment, in the substrate heating step, the substrate is heated under an atmosphere of $N_2$ gas.

With the configuration of this embodiment, the substrate is heated under the $N_2$ gas atmosphere. $N_2$ gas forms a gas flow which carries decomposed residue by causing the same to be contained therein. Thus, the residue caused by hydrofluoric acid can be reliably removed.

In one embodiment, in the substrate heating step, the substrate is heated to not lower than 150° C.

With the configuration of this embodiment, the substrate is heated to not lower than 150° C. The residue caused by hydrofluoric acid is decomposed at not lower than 150° C. Therefore, the residue caused by hydrofluoric acid can be more reliably removed.

In a third aspect of the present invention, there is provided a substrate processing apparatus for processing a substrate having a first oxide film formed by a thermal oxidation process and a second oxide film containing impurities, comprising an HF gas feeding device configured to feed an HF gas toward the substrate, and a cleaning gas feeding device configured to feed a cleaning gas containing at least $NH_3$ gas toward the substrate fed with the HF gas.

In a fourth aspect of the present invention, there is provided a substrate processing apparatus for processing a substrate having a first oxide film formed by a thermal oxidation process and a second oxide film containing impurities, comprising an HF gas feeding device configured to feed an HF gas toward the substrate, and a substrate heating device configured to heat the substrate fed with the HF gas.

The above and other objects, features, and advantages of the invention will become more apparent from the following detailed description taken in conjunction with the accompanying drawings.

BRIEF DESCRIPTION OF THE DRAWINGS

FIGS. 2A and 2B are cross-sectional views of a second processing module appearing in FIG. 1, in which:

FIGS. 7A and 7B are cross-sectional views of a second processing module appearing in FIG. 6, in which:

DETAILED DESCRIPTION OF THE PREFERRED EMBODIMENTS

The present invention will now be described in detail with reference to the drawings showing preferred embodiments thereof.

First, a description will be given of a substrate processing system including a substrate processing apparatus according to a first embodiment of the present invention.

Figure 1:
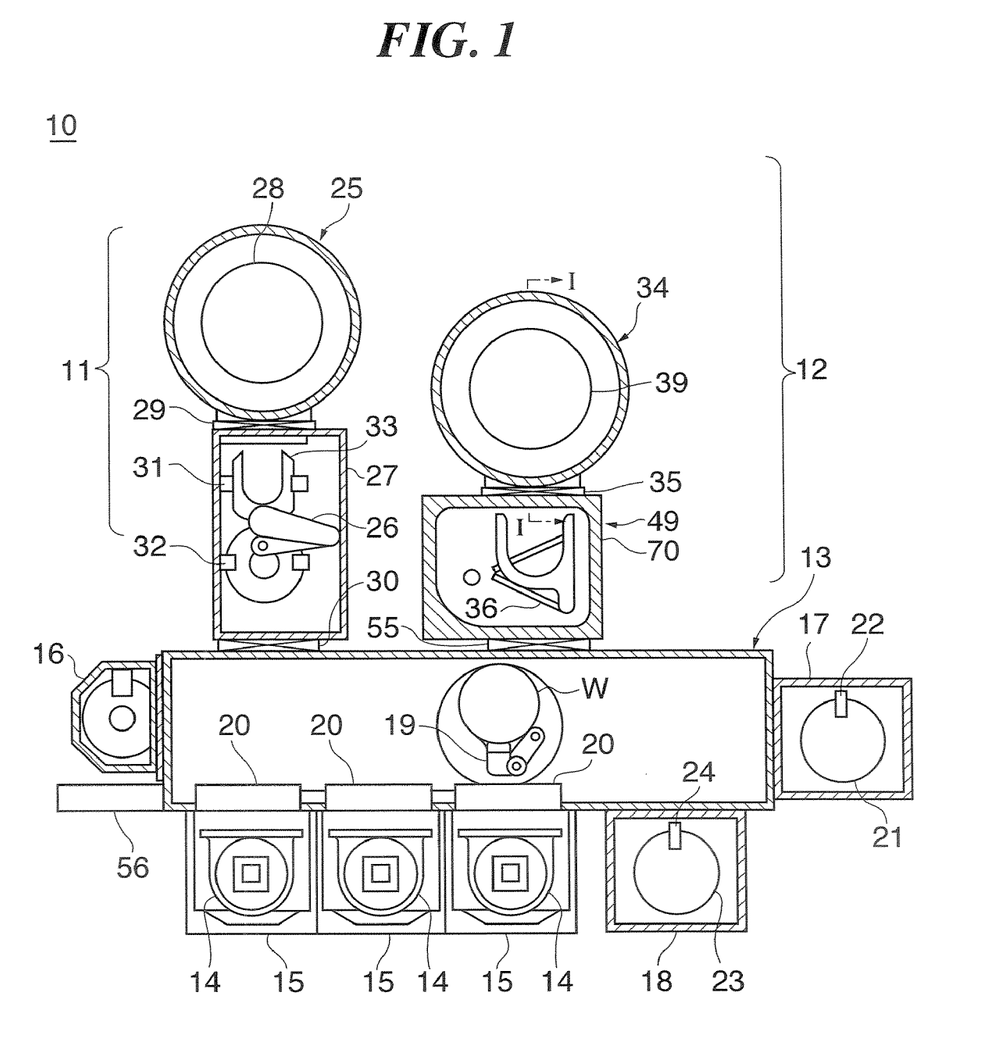
FIG. 1 is a schematic plan view of a substrate processing system including a substrate processing apparatus according to a first embodiment of the present invention.

FIG. 1 is a schematic plan view of the substrate processing system including the substrate processing apparatus according to the present embodiment.

As shown in FIG. 1, the substrate processing system 10 is comprised of a first process ship 11 for carrying out plasma processing on a wafer (substrate) for semiconductor devices (hereinafter simply referred to as "the wafer") W, a second process ship 12 (substrate processing apparatus) that is disposed parallel to the first process ship 11 and is configured to carry out a predetermined process, described hereinafter, on the wafer W having undergone the plasma processing in the first process ship 11, and a loader module 13 formed as a common transfer chamber with a rectangular shape, as viewed in plan view, to which are connected the first process ship 11 and the second process ship 12.

In addition to the first process ship 11 and the second process ship 12, the loader module 13 has connected thereto three FOUP mounting stages 15 on each of which is mounted a FOUP (Front Opening Unified Pod) 14, which is a container housing twenty-five of the wafers W, an orienter 16 that carries out pre-alignment of the position of each wafer W transferred out from the FOUP 14, and first and second IMS's (Integrated Metrology Systems, made by Therma-Wave, Inc.) 17 and 18 for measuring the surface state of each wafer W.

The first process ship 11 and the second process ship 12 are each connected to a side wall of the loader module 13 in a longitudinal direction of the loader module 13, and disposed in facing relation to the three FOUP mounting stages 15 with the loader module 13 therebetween. The orienter 16 is disposed at one end of the loader module 13 in the longitudinal direction of the loader module 13. The first IMS 17 is disposed at the other end of the loader module 13 in the longitudinal direction of the loader module 13. The second IMS 18 is disposed alongside the three FOUP mounting stages 15.

A SCARA-type dual arm transfer arm mechanism 19 for transferring the wafers W is disposed inside the loader module 13, and three loading ports 20 through which the wafers W are introduced into the loader module 13 are disposed in a side wall of the loader module 13 in correspondence with the FOUP mounting stages 15. The transfer arm mechanism 19 takes a wafer W out from a FOUP 14 mounted on a FOUP mounting stage 15 through the associated loading port 20, and transfers the removed wafer W into and out of the first process ship 11, the second process ship 12, the orienter 16, the first IMS 17, and the second IMS 18.

The first IMS 17 is an optical monitor having a mounting stage 21 on which is mounted a wafer W that has been transferred into the first IMS 17, and an optical sensor 22 that is directed at the wafer W mounted on the mounting stage 21. The first IMS 17 measures the surface shape of the wafer W, for example, the thickness of a polysilicon film, and CD (critical dimension) values of wiring grooves, gate electrodes and so on. The second IMS 18 is also an optical monitor, and has a mounting stage 23 and an optical sensor 24 corresponding to the mounting stage 21 and the optical sensor 22 of the first IMS 17, respectively.

The first process ship 11 has a first processing module 25 for carrying out plasma processing on each wafer W, and a first load lock module 27 containing a link-type single pick-type first transfer arm 26 for transferring each wafer W into and out of the first processing module 25.

The first processing module 25 has a cylindrical process chamber, and an upper electrode and a lower electrode (neither of which is shown) disposed in the chamber. The distance between the upper electrode and the lower electrode is set to an appropriate value for carrying out etching as plasma processing on each wafer W. The lower electrode has in a top portion thereof an ESC (electrostatic chuck) 28 for chucking the wafer W thereto using a Coulomb force or the like.

In the first processing module 25, a process gas containing a CF-based gas is introduced into the chamber and an electric field is generated between the upper electrode and the lower electrode, whereby the introduced process gas is turned into plasma so as to produce ions and radicals. The wafer W is etched by the ions and radicals.

In the first process ship 11, the internal pressure of the loader module 13 is held at atmospheric pressure, whereas the internal pressure of the first processing module 25 is held at vacuum. The first load lock module 27 is thus provided with a vacuum gate valve 29 in a connecting part between the first load lock module 27 and the first processing module 25, and an atmospheric gate valve 30 in a connecting part between the first load lock module 27 and the loader module 13, whereby the first load lock module 27 is constructed as a preliminary vacuum transfer chamber whose internal pressure can be adjusted.

Within the first load lock module 27, the first transfer arm 26 is disposed in an approximately central portion of the first load lock module 27, first buffers 31 are disposed toward the first processing module 25 with respect to the first transfer arm 26, and second buffers 32 are disposed toward the loader module 13 with respect to the first transfer arm 26. The first buffers 31 and the second buffers 32 are disposed above a track along which a supporting portion (pick) 33 moves, the supporting portion 33 being disposed at the distal end of the first transfer arm 26 and being for supporting each wafer W. After having being subjected to plasma processing, each wafer W is temporarily laid by above the track of the supporting portion 33, whereby swapping over of the wafer W that has been subjected to plasma processing and a wafer W yet to be subjected to plasma processing can be carried out smoothly in the first processing module 25.

The second process ship 12 has a second processing module 34 for carrying out a predetermined process, described in detail hereinafter, on each wafer W, and a second load lock module 37 connected to the second processing module 34 via a vacuum gate valve 35 and containing a link-type single-pick type second transfer arm 36 for transferring each wafer W into and out of the second processing module 34.

Figures 2A, 2B:
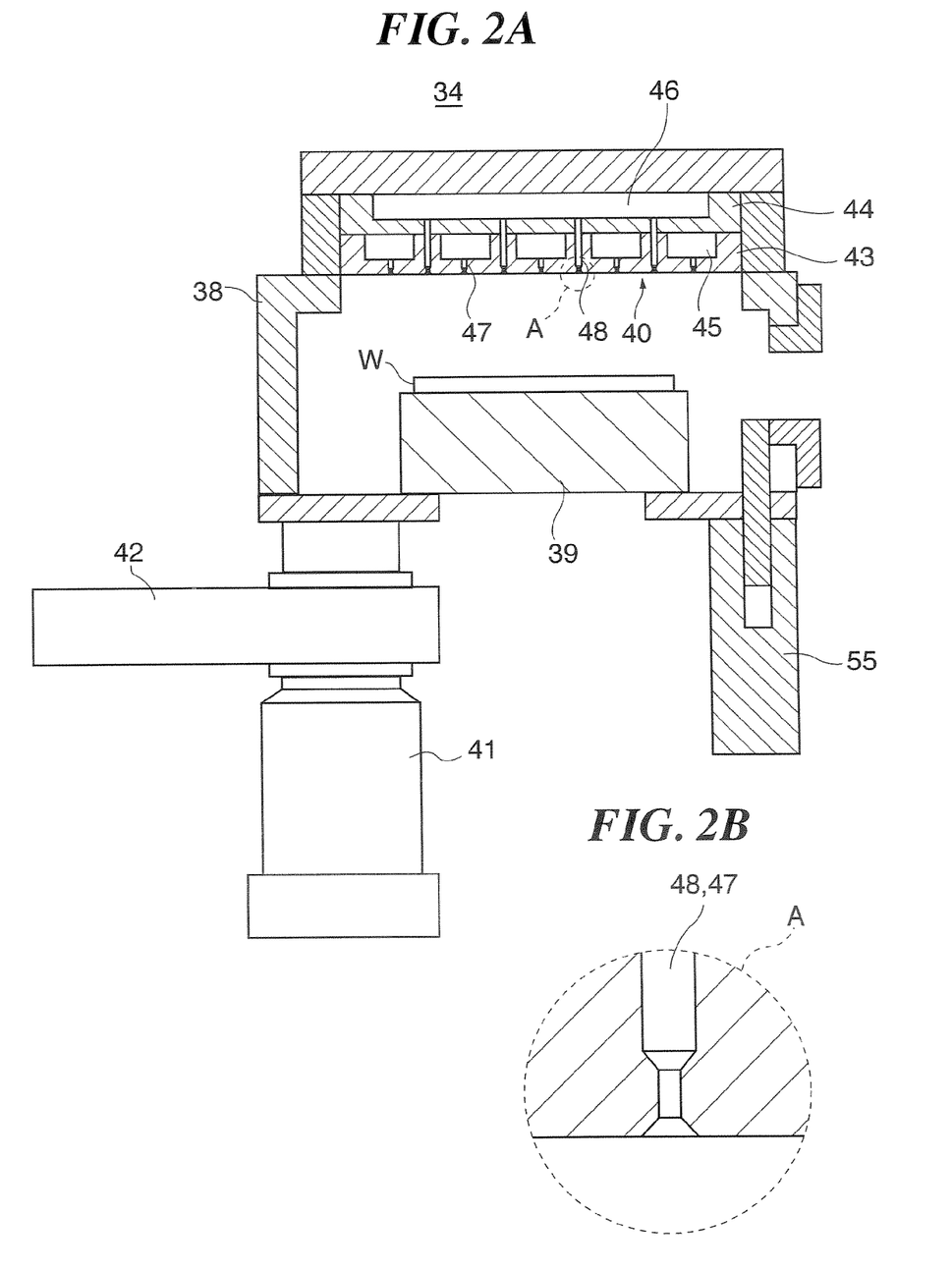
FIG. 2A is a cross-sectional view taken on line I-I of FIG. 1.
FIG. 2B is an enlarged view of a portion A appearing in FIG. 2A.

FIGS. 2A and 2B are cross-sectional views of the second processing module appearing in FIG. 1. FIG. 2A is a cross-sectional view taken on line I-I of FIG. 1, and FIG. 2B is an enlarged view of a portion A appearing in FIG. 2A.

Referring to FIG. 2A, the second processing module 34 has a cylindrical process chamber (chamber) 38, a wafer W mounting stage 39 disposed in the chamber 38, a shower head 40 disposed above the chamber 38 in facing relation to the mounting stage 39, a TMP (Turbo Molecular Pump) 41 for exhausting gas out from the chamber 38, and an APC (Adaptive Pressure Control) valve 42 that is a variable butterfly valve disposed between the chamber 38 and the TMP 41 for controlling the pressure within the chamber 38.

The shower head 40 is comprised of a disk-shaped lower-layer gas feeding part 43 (cleaning gas feeding device) and a disk-shaped upper-layer gas feeding part 44 (HF gas feeding device) The upper-layer gas feeding part 44 is disposed on the lower-layer gas feeding part 43. Further, the lower-layer gas feeding part 43 has first buffer chambers 45 therein, and the upper-layer gas feeding part 44 has a second buffer chamber 46 therein. The first buffer chambers 45 and the second buffer chamber 46 are communicated with the chamber 38 via gas-passing holes 47 and 48, respectively.

The first buffer chambers 45 in the lower-layer gas feeding part 43 of the shower head 40 are connected to an $NH_3$ (ammonia) gas supply system (not shown). The $NH_3$ gas supply system supplies $NH_3$ gas (cleaning gas) into the first buffer chambers 45. The $NH_3$ gas supplied into the first buffer chambers 45 is fed into the chamber 38 through the gas-passing holes 47.

On the other hand, the second buffer chamber 46 in the upper-layer gas feeding part 44 of the shower head 40 is connected to an HF gas supply system (not shown). The HF gas supply system supplies HF gas into the second buffer chamber 46. The HF gas supplied into the second buffer chamber 46 is fed into the chamber 38 through the gas-passing holes 48. The upper-layer gas feeding part 44 of the shower head 40 incorporates a heater (not shown), such as a heating element. The heating element controls the temperature of the HF gas in the second buffer chamber 46.

A portion of each of the gas-passing holes 47 and 48 where the gas-passing hole 47 or 48 opens out into the chamber 38 is formed to widen out toward an end thereof as shown in FIG. 2B. This makes it possible to efficiently diffuse the $NH_3$ gas or the HF gas into the chamber 38. Further, each of the gas-passing holes 47 and 48 has a cross-sectional shape having a constriction therein, so that residue and the like formed in the chamber 38 can be prevented from flowing back into the gas-passing holes 47 and 48 and then into the first buffer chambers 45 and the second buffer chamber 46.

Further, in the second processing module 34, a heater (not shown), such as a heating element, is built into the side wall of the chamber 38. This makes it possible to set the temperature of the atmosphere above the normal temperature, thereby promoting removal of a BPSG film 63, referred to hereinafter, by hydrofluoric acid. Further, the heating element built in the side wall heats the side wall to thereby prevent residue formed in the process of removal of the BPSG film 63 by hydrofluoric acid from being deposited on the inner surface of the side wall.

The mounting stage 39 has a coolant chamber (not shown) as a temperature adjusting mechanism. A coolant, for example, cooling water or a Galden fluid, held at a predetermined temperature is circulated through the coolant chamber. A processing temperature of the wafer W held on an upper surface of the mounting stage 39 is controlled through the temperature of the coolant.

Referring again to FIG. 1, the second load lock module 37 has a box-shaped transfer chamber (chamber) 49 containing the second transfer arm 36. The internal pressure of the loader module 13 is held at atmospheric pressure, whereas the internal pressure of the second processing module 34 is held below the atmospheric pressure, for example at vacuum. The second load lock module 37 is thus provided with a vacuum gate valve 35 in a connecting part between the second load lock module 37 and the second processing module 34, and an atmospheric door valve 55 in a connecting part between the second load lock module 37 and the loader module 13, whereby the second load lock module 37 is constructed as a preliminary vacuum transfer chamber whose internal pressure can be adjusted.

Further, the substrate processing system 10 has an operation panel 56 disposed at one end of the loader module 13 in the longitudinal direction of the loader module 13. The operation panel 56 has a display section comprised of, for example, an LCD (liquid crystal display), for displaying the state of operation of the component elements of the substrate processing apparatus 10.

Figure 3A:
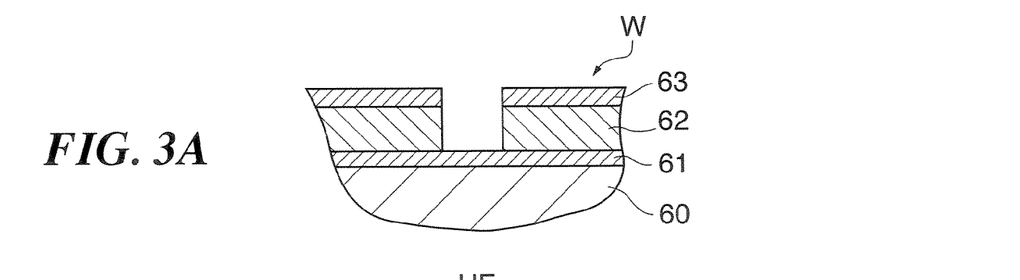
FIGS. 3A to 3E constitute a process diagram showing a substrate processing method executed by the substrate processing system shown in FIG. 1.

By the way, in the case of a wafer W having a silicon substrate 60 shown in FIG. 3A, on which a $SiO_2$ thermal oxide film 61 (first oxide film) formed by a thermal oxidation process, a polysilicon film 62 (silicon-containing layer), and a BPSG film 63 (second oxide film) formed e.g. by a CVD process are deposited in a layered manner, to selectively etch the BPSG film 63, HF gas or a mixed gas of HF gas and $H_2O$ gas is used without turning the same into plasma, as described hereinbefore. It should be noted that the BPSG film 63 causes the thermal oxide film 61 to be partially exposed when the polysilicon film 62 has been etched.

Figure 4:
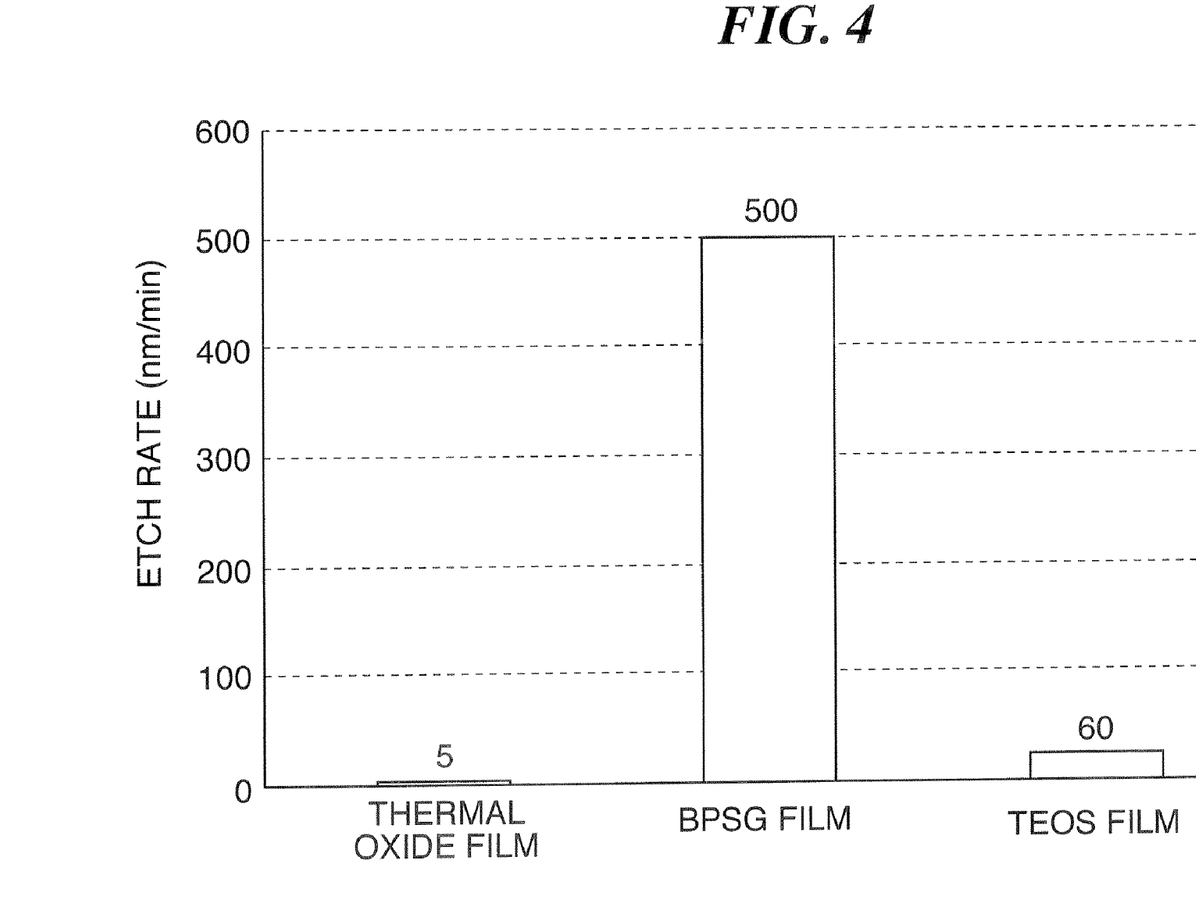
FIG. 4 is a graph showing the relationship between the kinds of oxide films and etch rates.

The present inventor carried out various experiments so as to further enhance the selection ratio of the BPSG film 63 to the thermal oxide film 61, and found out that under an environment where very little $H_2O$ is present, if only HF gas is fed toward a wafer W without feeding $H_2O$ gas, it is possible to increase the etch rate of the BPSG film 63 up to 500 nm/min with the etch rate of the thermal oxide film 61 held at 5 nm/min, as shown in a graph in FIG. 4. In other words, it was found out that the selection ratio of the BPSG film 63 to the thermal oxide film 61 can be increased up to 100. It should be noted that the present inventor also found out that under the above-mentioned condition, the etch rate of a TEOS film can be increased up to 20 nm/min.

Further, the present inventor carried out assiduous studies on a mechanism for realizing the high selection ratio, and came to set up a hypothesis described below.

HF gas combines with $H_2O$ to form hydrofluoric acid, and the hydrofluoric acid removes an oxide film by eroding the same. Under an environment with very little $H_2O$, HF gas is required to combine with water ($H_2O$) molecules contained in an oxide film, so to be turned into hydrofluoric acid.

Since the BPSG film 63 is formed by vapor deposition by the CVD process or the like, the film structure of the BPSG film 63 is loose, and hence water molecules are easy to be adsorbed thereon. Therefore, the BPSG film 63 contains water molecules to some extent. HF gas having reached the BPSG film 63 combines with these water molecules to form hydrofluoric acid. Then, this hydrofluoric acid erodes the BPSG film 63.

In contrast, the thermal oxide film 61 is formed by a thermal oxidation process under an environment of 800 to 900° C., and hence contains no water molecules when the film is formed. Further, the film structure of the thermal oxide film 61 is tight, and hence water molecules are not easy to be adsorbed. Therefore, the thermal oxide film 61 contains very few water molecules. Even when the fed HF gas has reached the thermal oxide film 61, the HF gas is not turned into hydrofluoric acid since no water molecules are present therein. As a consequence, erosion of the thermal oxide film 61 is prevented.

Thus, under an environment with very little $H_2O$, by feeding only HF gas toward the wafer W without feeding $H_2O$ gas, it is possible to increase the selection ratio of the BPSG film 63 to the thermal oxide film 61 up to 100.

However, when the BPSG film 63 is removed by hydrofluoric acid, $SiO_2$ contained in the BPSG film 63 and the hydrofluoric acid (HF) chemically react with each other as expressed by the following reaction formulas:

$$SiO_2 + 4HF \rightarrow SiF_4 + 2H_2O\uparrow$$

$$SiF_4 + 2HF \rightarrow H_2SiF_6$$

whereby residue ($H_2SiF_6$) is formed.

To solve this problem, the present embodiment uses $NH_3$ so as to remove the residue. Specifically, $NH_3$ gas is fed toward $H_2SiF_6$ to cause chemical reaction expressed by the following reaction formula:

$$H_2SiF_6 + 2NH_3 \rightarrow 2NH_4F + SiF_4\uparrow$$

whereby $NH_4F$ (ammonium fluoride) and $SiF_4$ (silicon tetrafluoride) are produced. $NH_4F$ is a substance easy to sublimate. Therefore, if the temperature of the atmosphere is set to a temperature a slightly higher than the normal temperature, $NH_4F$ sublimates and hence can easily removed.

In short, according to the present embodiment, $H_2SiF_6$ as residue caused by the reaction between $SiO_2$ and hydrofluoric acid is removed through reaction with $NH_3$ and sublimation.

Next, a description will be given of a substrate processing method according to the present embodiment.

Figure 5:
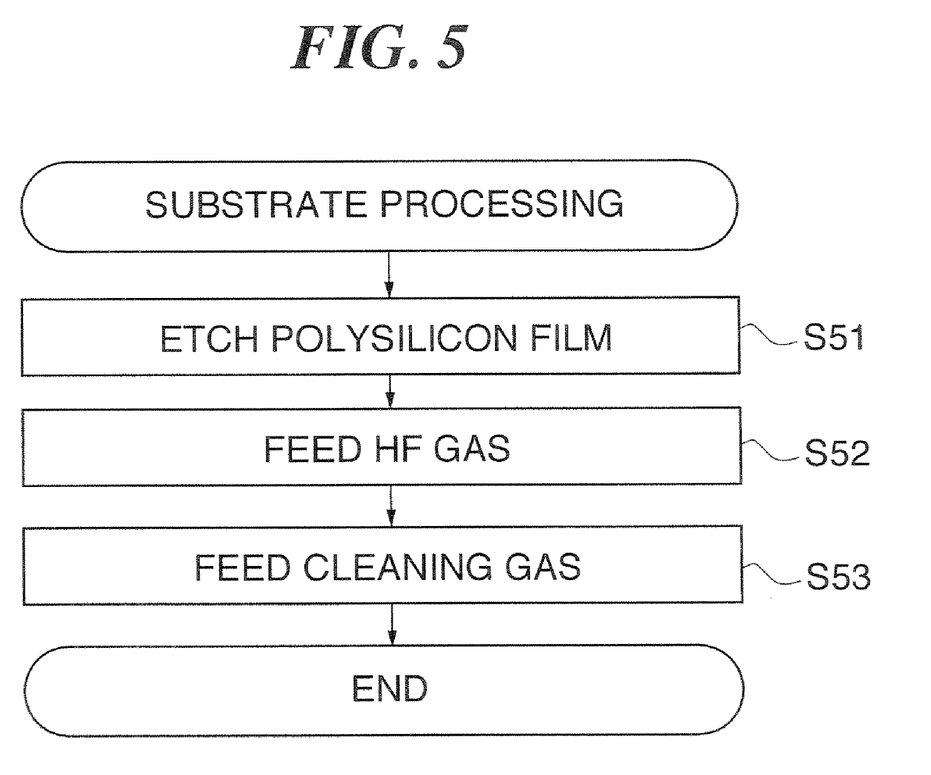
FIG. 5 is a flowchart of the substrate processing method executed by the substrate processing system shown in FIG. 1.

FIG. 5 is a flowchart of the substrate processing method executed by the substrate processing system shown in FIG. 1.

First, a wafer W is prepared which has the polysilicon film 62 uniformly formed on the thermal oxide film 61 and the BPSG film formed on the polysilicon film 62 in accordance with a predetermined pattern such that the polysilicon film 62 is partially exposed. Then, the wafer W is conveyed into a chamber of the first processing module 25 and is placed on the ESC 28.

Next, a process gas containing a CF-based gas is introduced into the chamber, and an electric field is generated between the upper electrode and the lower electrode, whereby the introduced process gas is turned into plasma to produce ions and radicals, and the ions and radicals etch the exposed polysilicon film 62 (step S51). At this time, via-holes and trenches are formed by etching of the polysilicon film 62, and the thermal oxide film 61 is partially exposed (see FIG. 3A).

Then, the wafer W is transferred out from the chamber of the first processing module 25 and transferred into the chamber 38 of the second processing module 34 via the loader module 13. At this time, the wafer W is mounted on the mounting stage 39.

Figure 3B:
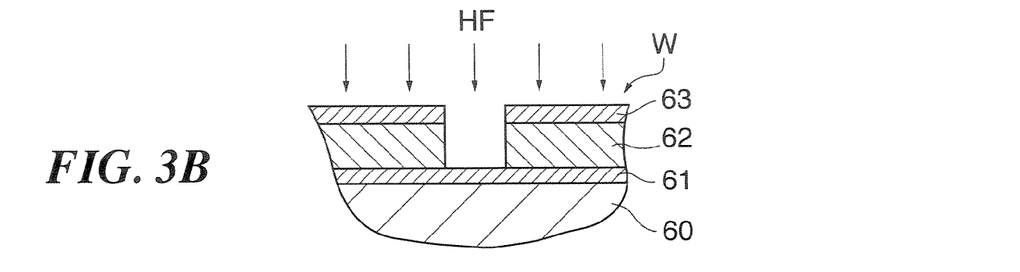

Next, the pressure within the chamber 38 is set to $1.3 \times 10^1$ to $1.1 \times 10^3$ Pa (1 to 8 Torr) by the APC valve 42 and so forth, and the temperature of the atmosphere in the chamber 38 is set to 40 to 60° C. by the heater built in the side wall. Then, HF gas is fed toward the wafer W from the upper-layer gas feeding part 44 of the shower head 40 at a flow rate of 40 to 60 SCCM (HF gas feeding step) (step S52) (see FIG. 3B). At this time, almost all water molecules are eliminated from the chamber 38. $H_2O$ gas is not fed into the chamber 38.

Figure 3C:
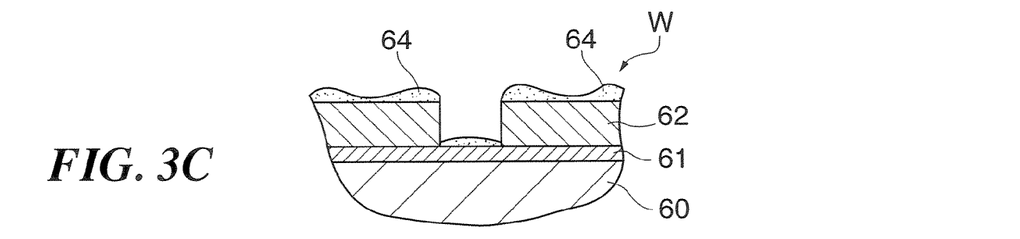

The HF gas having reached the BPSG film 63 combines with water molecules contained in the BPSG film 63 to form hydrofluoric acid. This hydrofluoric acid progressively erodes the BPSG film 63, whereby the BPSG film 63 is selectively etched. During this process, residue 64 is formed by reaction between $SiO_2$ in the BPSG film 63 and the hydrofluoric acid, to be deposited on the polysilicon film 62 and the exposed portions of the thermal oxide film 61 (see FIG. 3C).

Figure 3D:
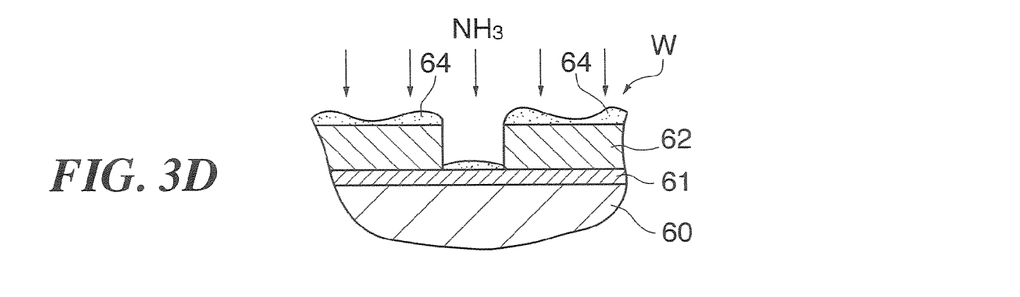
Figure 3E:
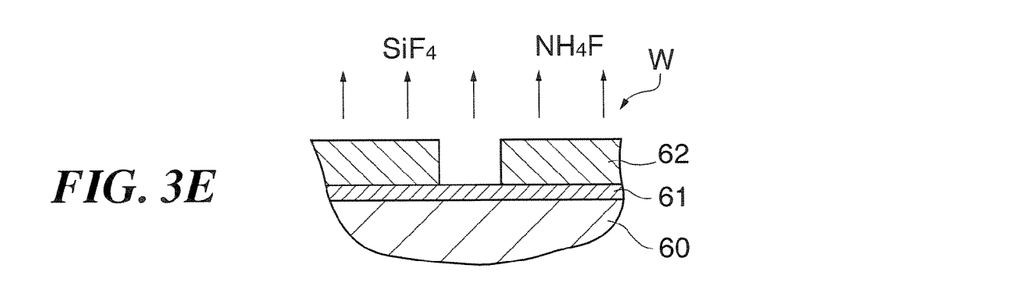

Next, feeding of the HF gas into the chamber 38 is stopped, whereafter $NH_3$ gas is fed toward the wafer W from the lower-layer gas feeding part 43 of the shower head 40 (cleaning gas feeding step) (step S53) (see FIG. 3D). At this time, the $NH_3$ gas reacts with $H_2SiF_6$ forming the residue 64 to produce $NH_4F$ and $SiF_4$. Then, the temperature of the atmosphere in the chamber 38 is set to a temperature a slightly higher than the normal temperature to thereby cause sublimation of the $NH_4F$ (see FIG. 3E).

Then, the wafer W is conveyed out from the chamber 38 of the second processing module 34, followed by terminating the present process.

According to the process shown in FIG. 5, HF gas is fed toward a wafer W having the thermal oxide film 61 and the BPSG film 63, and then $NH_3$ gas is fed toward the wafer W. Hydrofluoric acid produced from the HF gas selectively etches the BPSG film 63 but forms the residue 64 formed of $H_2SiF_6$ at the same time. The $NH_3$ gas reacts with $H_2SiF_6$ to produce $NH_4F$ and $SiF_4$. $NH_4F$ is easy to sublimate, and hence the residue 64 can be removed through reaction with $NH_3$ and sublimation. This makes it possible to easily remove the residue 64 formed of $H_2SiF_6$.

In the process shown in FIG. 5, almost all water molecules are eliminated from the chamber 38 before HF gas is fed toward the wafer W, and $H_2O$ gas is not fed into the chamber 38. Therefore, the HF gas hardly combines with water molecules in the thermal oxide film 61 containing very few water molecules, and hence hydrofluoric acid is hardly produced. Therefore, erosion of the thermal oxide film 61 hardly occurs, which makes it possible to more reliably perform selective etching on the BPSG film 63.

Further, in the process shown in FIG. 5, the polysilicon film 62 is etched before removal of the BPSG film 63 by feeding HF gas. Therefore, it is possible to utilize the BPSG film 63 as a hard mask, thereby reliably etching the polysilicon film 62 into a desired shape.

In the process shown in FIG. 5, almost all water molecules are eliminated from the chamber 38, and H₂O gas is not fed into the chamber 38. Further, water molecules contained in the BPSG film 63 are consumed for reaction between SiO₂ and hydrofluoric acid. Therefore, the inside of the chamber 38 can be maintained in a very dry state, which makes it possible to suppress particle from being generated and water marks on the wafer W from being caused by water molecules, to thereby improve the reliability of a semiconductor device manufactured from the wafer W.

Although in the process shown in FIG. 5, NH₃ gas is fed into the chamber 38 for removal of the residue 64, a gas to be fed for the purpose is not limited to NH₃ gas, but a mixed gas of NH₃ gas and another gas, such as N₂ gas, may be fed.

Further, according to the process shown in FIG. 5, selective etching of the BPSG film 63 and removal of the residue 64 can be performed in the same second processing module 34. Therefore, it is possible to reduce the size of the substrate processing system 10.

Next, a description will be given of a substrate processing system including a substrate processing apparatus according to a second embodiment of the present invention.

The present embodiment has basically the same construction and effects as those of the above-described first embodiment, and is distinguished from the first embodiment only in the construction of the second process ship. Therefore, duplicate description of the construction is omitted, and only different points of the construction and effects of the present embodiment from the first embodiment will be described hereafter.

Figure 6:
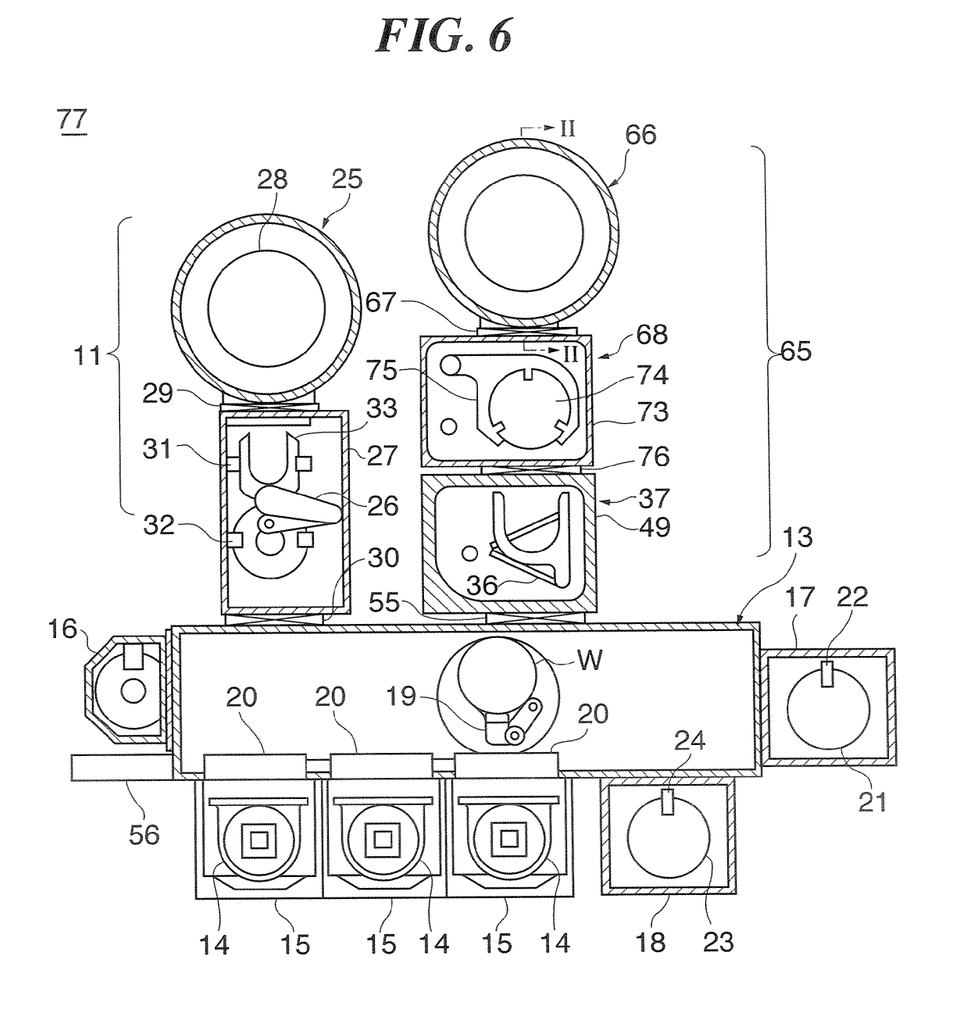
FIG. 6 is a schematic plan view of a substrate processing system including a substrate processing apparatus according to a second embodiment of the present invention.

FIG. 6 is a schematic plan view of the substrate processing system including the substrate processing apparatus according to the present embodiment.

As shown in FIG. 6, the substrate processing system 77 is comprised of the first process ship 11, a second process ship 65 (substrate processing apparatus) for carrying out a predetermined process, described in detail hereinafter, on each wafer W having undergone plasma processing in the first process ship 11, and the loader module 13.

The second process ship 65 has a second processing module 66 for carrying out selective etching, described in detail hereinafter, on each wafer W, a third processing module 68 connected to the second processing module 66 via a vacuum gate valve 67, for carrying out heating processing, described in detail hereinafter, on the wafer W, and the second load lock module 37.

Figures 7A, 7B:
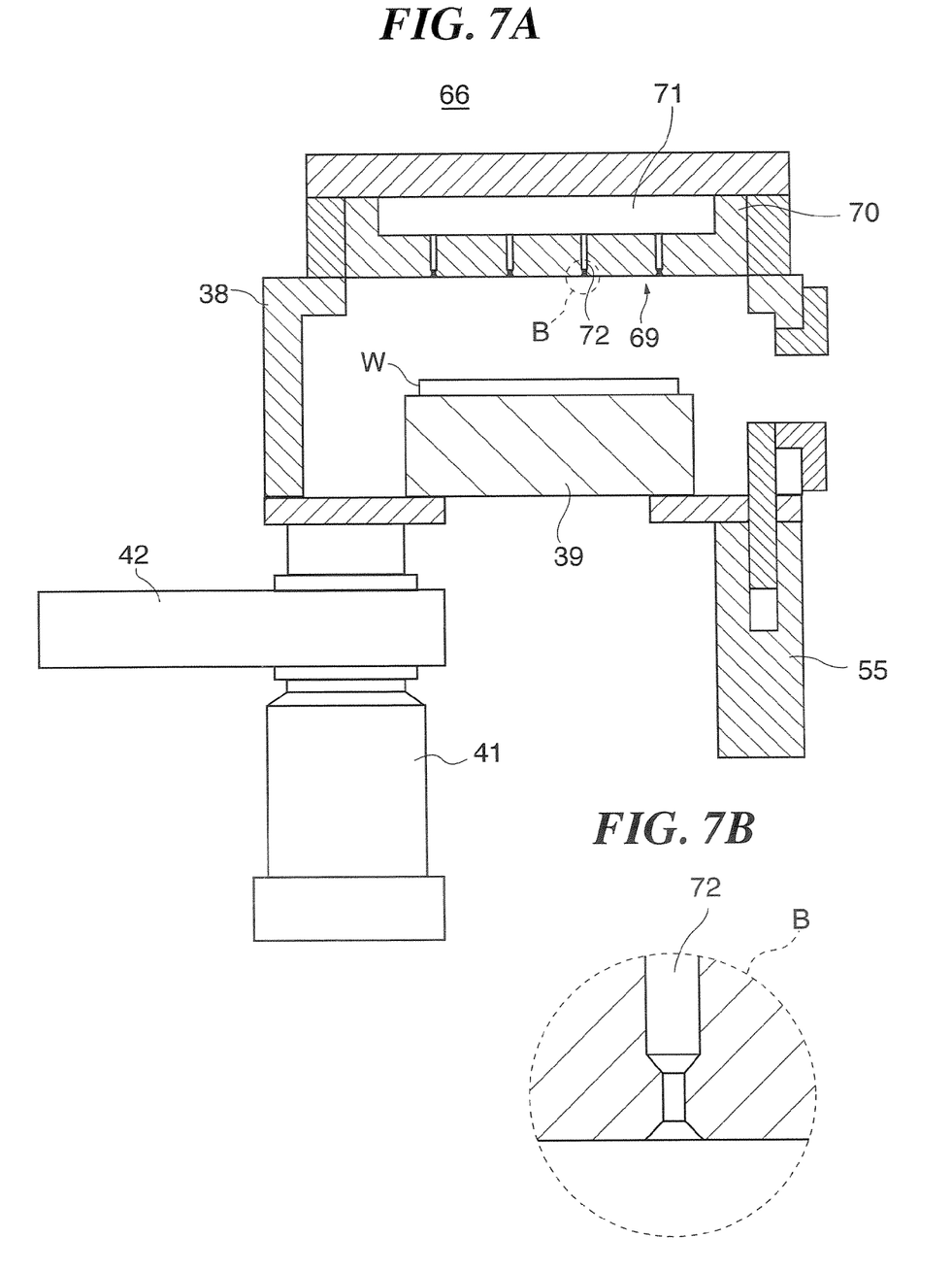
FIG. 7A is a cross-sectional view taken on line II-II of FIG. 6.
FIG. 7B is an enlarged view of a portion B appearing in FIG. 7A.

FIGS. 7A and 7B are cross-sectional views of the second processing module appearing in FIG. 6. FIG. 7A is a cross-sectional view taken on line II-II of FIG. 6, and FIG. 7B is an enlarged view of a portion B appearing in FIG. 7A. It should be noted that the second processing module 66 has basically the same construction and effects as those of the second processing module 34 in the first embodiment, and is distinguished from the first embodiment only in the construction of the shower head. Therefore, duplicate description of the construction and effects is omitted.

Referring to FIG. 7A, the second processing module 66 has a shower head 69 disposed above the chamber 38. The shower head 69 has a disk-shaped gas feeding part 70 (HF gas feeding device), and the gas feeding part 70 has a buffer chamber 71. The buffer chamber 71 is communicated with the chamber 38 via gas-passing holes 72.

Further, the buffer chamber 71 in the gas feeding part 70 of the shower head 69 is connected to an HF gas supply system. The HF gas supply system supplies HF gas into the buffer chamber 71. The HF gas supplied into the buffer chamber 71 is fed into the chamber 38 through the gas-passing holes 72.

The gas feeding part 70 of the shower head 69 incorporates a heater (not shown), such as a heating element. This heating element controls the temperature of the HF gas in the buffer chamber 71.

Similarly to the gas-passing holes 47 (48) of the shower head 40, a portion of each of the gas-passing holes 72 of the shower head 69 where the gas-passing hole 72 opens out into the chamber 38 is formed to widen out toward an end thereof (see FIG. 7B).

Referring again to FIG. 6, the third processing module 68 has a box-shaped process chamber (chamber) 73, a stage heater 74 (substrate heating device) disposed within the chamber 73 as a wafer-mounting stage, a buffer arm 75 disposed near the stage heater 74, for upwardly lifting each wafer W mounted on the stage heater 74, and a gas-introducing part (not shown) via which an inert gas, such as N₂ gas, is introduced into the chamber 73.

The stage heater 74 is formed of aluminum having an oxide film formed on a surface thereof, and is configured to heat each wafer W mounted thereon up to a predetermined temperature by a built-in heater comprised of an electrically heated wire. The buffer arm 75 causes each wafer W subjected to plasma processing to be temporarily laid by above the track of the second transfer arm 36 to thereby enable smooth swapping over of wafers W in the second processing module 66 and the third processing module 68.

In the substrate processing system 77, the internal pressure of the loader module 13 is held at atmospheric pressure, whereas the internal pressures of the second processing module 66 and the third processing module 68 are held at vacuum or below the atmospheric pressure. The second load lock module 37 is thus provided with a vacuum gate valve 76 in a connecting part between the second load lock module 37 and the third processing module 68.

By the way, H₂SiF₆ produced by reaction between SiO₂ and hydrofluoric acid is thermally decomposed according to the following reaction formula:

$$H_2SiF_6 + Q(\text{thermal energy}) \rightarrow 2HF\uparrow + SiF_4\uparrow$$

to produce HF and SiF₄.

In the present embodiment, H₂SiF₆ as residue caused by the reaction between SiO₂ and hydrofluoric acid is removed through thermal decomposition utilizing decomposition of H₂SiF₆ expressed by the above formula.

Next, a description will be given of a substrate processing method according to the present embodiment.

Figure 8:
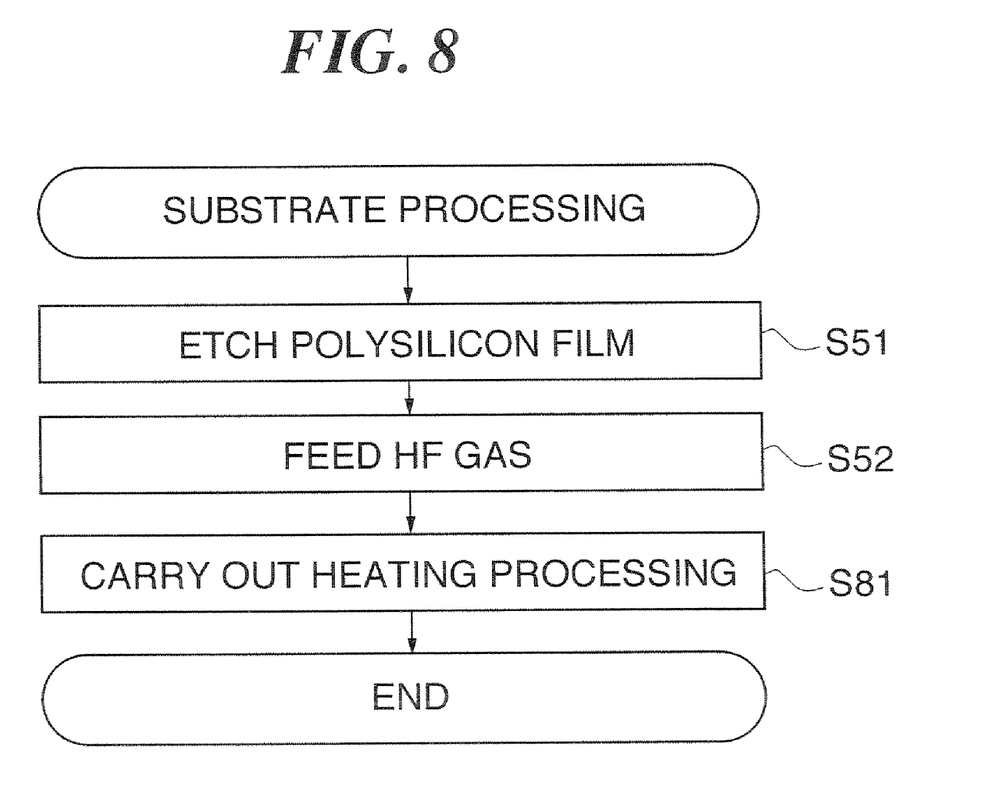
FIG. 8 is a flowchart of a substrate processing method executed by the substrate processing system shown in FIG. 6.

FIG. 8 is a flowchart of the substrate processing method executed by the substrate processing system shown in FIG. 6.

First, the step S51 of the process shown in FIG. 5 is executed. Then, a wafer W is transferred out from the chamber of the first processing module 25 and transferred into the chamber 38 of the second processing module 66 via the loader module 13. At this time, the wafer W is mounted on the mounting stage 39.

Next, the step S52 of the process shown in FIG. 5 is executed, whereafter the wafer W is transferred out from the chamber 38 of the second processing module 66 and transferred into the chamber 73 of the third processing module 68. At this time, the wafer W is mounted on the stage heater 74. Then, the wafer W mounted on the stage heater 74 is heated by the stage heater 74 to a predetermined temperature, specifically to not lower than 150° C. (substrate heating step) (step S81). Further, the gas-introducing part introduces N₂ gas into the chamber 73. The N₂ gas introduced into the chamber 73 forms a gas flow in accordance with decompression by the TMP 41. At this time, H₂SiF₆ forming residue 64 is heated to be decomposed into HF and $SiF_4$, and the HF and the $SiF_4$ produced by the decomposition are caused to be contained in the gas flow and removed.

Then, the wafer W is conveyed out from the chamber 73 of the third processing module 68, followed by terminating the present process.

According to the process shown in FIG. 8, HF gas is fed toward a wafer W having the thermal oxide film 61 and the BPSG film 63, and then the wafer W is heated. Hydrofluoric acid produced from the HF gas selectively etches the BPSG film 63 but forms the residue 64 formed of $H_2SiF_6$ at the same time. However, the residue 64 is heated to be decomposed into HF and $SiF_4$. Therefore, the residue 64 can be removed by thermal decomposition. This makes it possible to easily remove the residue 64 formed of $H_2SiF_6$.

Figure 9:
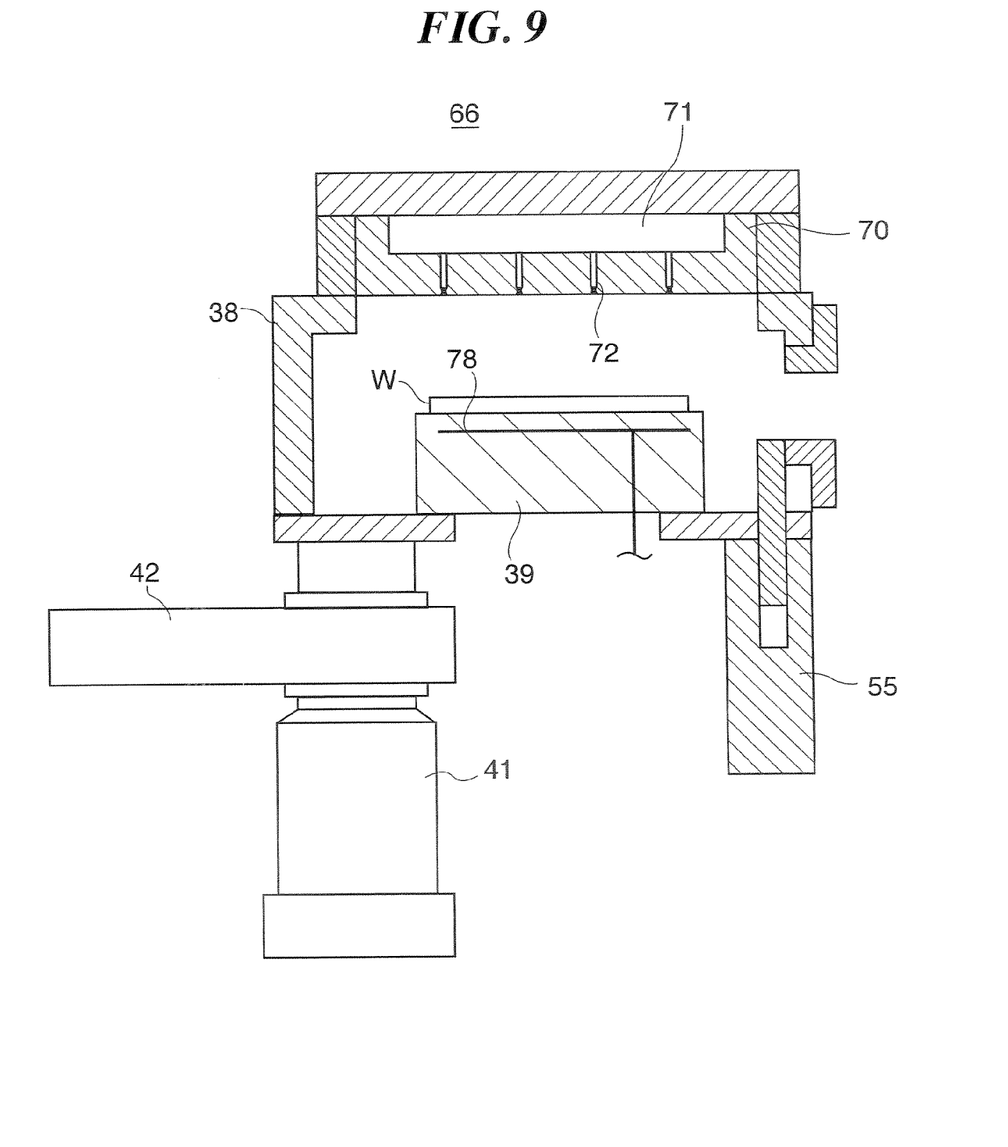
FIG. 9 is a cross-sectional view showing a variation of the second processing module in FIG. 7A.

Although in the process shown in FIG. 8, feeding of HF gas toward a wafer W and heating of the same are carried out by the respective different processing modules, these operations may be performed by a single processing module. Specifically, a heater 78 is provided within the mounting stage 39 of the second processing module 66, as shown in FIG. 9, and even after removal of the BPSG film 63 by hydrofluoric acid in the chamber 38, the wafer W is held on the mounting stage 39 without being transferred out from the chamber 38, and is heated by the heater 78 to not lower than 150° C. $H_2SiF_6$ produced from the reaction between $SiO_2$ and hydrofluoric acid is decomposed at not lower than 150° C. Therefore, it is possible to reliably remove $H_2SiF_6$ by thermally decomposing $H_2SiF_6$ into HF and $SiF_4$.

Further, in the process shown in FIG. 8, while the wafer W is heated, $N_2$ gas is introduced into the chamber 73 to generate a gas flow, so that HF and $SiF_4$ resulting from the thermal decomposition can be reliably removed by causing the same to be contained in the gas flow.

Although in the above described embodiments, the BPSG film 63 is selectively etched, an oxide film for selective etching is not limited to the BPSG film 63, but any oxide film that at least contains more impurities than the thermal oxide film 61 can be used. Specifically, a TEOS (Tetra Ethyl Ortho Silicate) film or a BPS (Boron Silicate Glass) film may be used for selective etching. Further, residue to be removed is not limited to $H_2SIF_6$, but the present invention can be applied to removal of any residue insofar as the residue is produced during removal of an oxide film by hydrofluoric acid.

Further, although in the foregoing description, the substrate processing system including the substrate processing apparatus according to either of the above described embodiments has two process ships disposed parallel to each other, the arrangement of the substrate processing system is not limited to this. Specifically, the substrate processing system may have a plurality of processing modules arranged in tandem or in clusters.

Furthermore, the substrate to be subjected to the process shown in FIG. 5 or the process shown in FIG. 8 is not limited to a semiconductor wafer, but the present invention can be applied to various kinds of substrates used for an LCD, an FPD (Flat Panel Display), etc., photomasks, CD substrates, printed circuit boards, and so forth.

Further, it is to be understood that the object of the present invention may also be accomplished by supplying the system or the apparatus, with a storage medium in which a program code of software, which realizes the functions of either of the above described embodiments, is stored, and causing a computer (or CPU or MPU) of the system or the apparatus or to read out and execute the program code stored in the storage medium.

In this case, the program code itself read from the storage medium realizes the novel functions of any of the above described embodiments, and therefore the program code and the storage medium in which the program code is stored constitute the present invention.

Examples of the storage medium for supplying the program code include a floppy (registered trademark) disk, a hard disk, a magnetic-optical disk, an optical disk such as a CD-ROM, a CD-R, a CD-RW, a DVD-ROM, a DVD-RAM, a DVD–RW, and a DVD+RW, a magnetic tape, a nonvolatile memory card, and a ROM. Alternatively, the program may be downloaded via a network.

Further, it is to be understood that the functions of either of the above described embodiments may be accomplished not only by executing the program code read out by a computer, but also by causing an OS (operating system) or the like which operates on the computer to perform a part or all of the actual operations based on instructions of the program code.

Further, it is to be understood that the functions of either of the above described embodiments may be accomplished by writing a program code read out from the storage medium into a memory provided on an expansion board inserted into a computer or a memory provided in an expansion unit connected to the computer and then causing a CPU or the like provided in the expansion board or the expansion unit to perform a part or all of the actual operations based on instructions of the program code.

What is claimed is:

1. A method of processing a substrate having a first oxide film formed by a thermal oxidation process and a second oxide film containing impurities in a chamber, comprising:
    eliminating $H_2O$ molecules from the chamber;
    feeding an HF gas toward the substrate to alter the second oxide film into residue; and
    feeding a cleaning gas containing at least $NH_3$ gas toward the substrate on which both the first oxide film and the residue exist contemporarily.

2. A method as claimed in claim 1, further comprising:
    etching a silicon-containing layer prior to feeding the HF gas toward the substrate,
    wherein the silicon-containing layer is formed on the first oxide film and is covered by the second oxide film, the second oxide film causing the silicon-containing layer to be partially exposed.

3. A method as claimed in claim 1, further comprising:
    setting a temperature of an atmosphere in the chamber above a normal temperature.

4. A method as claimed in claim 3, wherein setting the temperature of the atmosphere is to 40 to 60° C.

5. A method as claimed in claim 1, further comprising:
    setting a pressure within the chamber to $1.3 \times 10^1$ to $1.1 \times 10^3$ Pa.

6. A method as claimed in claim 1, wherein feeding the HF gas toward the substrate is at a flow rate of 40 to 60 SCCM.

7. A method as claimed in claim 1, wherein feeding the HF gas includes increasing a selection ratio of the second oxide film to the first oxide film up to 100.

8. A method as claimed in claim 1, wherein feeding the cleaning gas containing at least $NH_3$ gas toward the substrate includes only the first oxide film and the residue existing contemporarily on the substrate, and the cleaning gas removing only the residue.

9. A method as claimed in claim 1, wherein eliminating the $H_2O$ molecules from the chamber does not eliminate adsorbed $H_2O$ molecules contained in the second oxide film, which has a loose film structure, and the first oxide film has a tight film structure and contains approximately no adsorbed water molecules.

10. A method as claimed in claim 1, wherein feeding an HF gas toward the substrate to alter the second oxide film into the residue includes the residue being $H_2SiF_6$.

11. A method as claimed in claim 10, wherein feeding the cleaning gas containing at least $NH_3$ gas toward the substrate includes the $H_2SiF_6$ residue being converted into $SiF_4$ gas and an $NH_4F$ substance.

12. A method as claimed in claim 1, wherein feeding the cleaning gas containing at least $NH_3$ gas toward the substrate includes the first oxide film and the residue existing contemporarily on the substrate without the second oxide film remaining.

* * * * *